United States Patent
Kalidas et al.

(10) Patent No.: US 6,396,136 B2
(45) Date of Patent: *May 28, 2002

(54) BALL GRID PACKAGE WITH MULTIPLE POWER/GROUND PLANES

(75) Inventors: Navinchandra Kalidas, Houston; Masood Murtuza; Raymond W. Thompson, both of Sugarland, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/469,476

(22) Filed: Dec. 22, 1999

Related U.S. Application Data

(60) Provisional application No. 60/114,314, filed on Dec. 31, 1998.

(51) Int. Cl.[7] .......................... H01L 23/52; H01L 23/04
(52) U.S. Cl. ..................... 257/691; 257/698; 257/700; 257/737; 257/738; 257/780; 257/778; 257/712
(58) Field of Search ................. 257/688, 689, 257/691, 698, 738, 778, 780, 712, 719, 713

(56) References Cited

U.S. PATENT DOCUMENTS

| | | | | |
|---|---|---|---|---|
| 5,521,435 A | * | 5/1996 | Mizukoshi | 257/698 |
| 5,530,288 A | * | 6/1996 | Stone | 257/700 |
| 5,616,958 A | * | 4/1997 | Laine et al. | 257/717 |
| 5,801,440 A | * | 9/1998 | Chu et al. | 257/691 |
| 5,835,355 A | * | 11/1998 | Dordi | 257/760 |
| 5,969,426 A | * | 10/1999 | Baba et al. | 257/778 |
| 6,175,158 B1 | * | 1/2001 | Degani et al. | 257/777 |
| 6,194,778 B1 | * | 2/2001 | Ohsawa et al. | 257/668 |
| 6,201,298 B1 | * | 3/2001 | Sato et al. | 257/691 |

* cited by examiner

*Primary Examiner*—Tom Thomas
*Assistant Examiner*—Nitin Parekh
(74) *Attorney, Agent, or Firm*—Gary C. Honeycutt; Fred Telecky; Arthur I. Navarro

(57) ABSTRACT

A package for a flip chip integrated circuit including an interposer with electrical interconnecting for signal, power, and ground contacts. Routing is accomplished on only two conductor layers through the use of selective planes and buses. Multiple power planes are provided on a single conductor level to support circuits having different operating voltages. A unique cavity down BGA package for a flip chip interconnected integrated circuit is provided by adhering the interposer to a thermally conductive stiffener or base, and using solder balls to attach the frame to the base and interposer. The assemblage forms a chip cavity with interconnecting vias to external BGA solder balls terminals located in the perimeter frame.

2 Claims, 6 Drawing Sheets

BALL GRID PACKAGE WITH MULTIPLE POWER/GROUND PLANES

This application claims benefit of Provisional Application No. 60/114,314 filed Dec. 31, 1998.

FIELD OF THE INVENTION

This invention is related to an integrated circuit device and more particularly to electrical interconnections in a ball grid array package.

BACKGROUND OF THE INVENTION

As the semiconductor industry moves toward higher circuit density, the number of input/output pins and the operating speed of the devices is increasing dramatically, as well as the number of circuits with more than one operating voltage. In order to minimize the complexity and the area of circuit boards required for these high pin count, multiple power supply devices, the integrated circuit packages are constructed with multilayer power and ground planes which can reduce pin count by providing common contacts for several inputs and outputs, and can allow improved electrical and thermal performance of the device.

In response to the demand for IC packages of higher lead count and smaller foot print, Ball Grid Array (BGA) packages continue to be developed. A BGA package is a surface mount package which is assembled to an external circuit board using an array of solder balls confined within the area of the package. An example of a BGA package is given in FIG. 1. Typically the BGA package 100 is in a "cavity up" configuration, indicating that the semiconductor chip 101 is attached to the top surface 103a (i.e., upward facing surface) of the substrate 103, and that solder balls 105 which interconnect the package to a printed wiring board are attached to the back side 103b (i.e., downward facing surface) of the substrate. The chip is electrically interconnected to traces on the substrate by wire bonding or by flip chip bump connections 107, as shown in FIG. 1. A lid 108 or other form of encapsulation covers the chip and provides mechanical and environmental protection.

Substrates of high performance and high pin count BGAs have multiple layers of metal traces separated by dielectric layers and connected through vias to provide power and ground planes, and these structures will be discussed in more detail later. Typically, a separate conductor and dielectric layer is required for each input/output function, such as a contact layer with routing for signal, power and ground, a ground plane, a power plane for each operating voltage, and a layer for the external contacts. Limitations of prior art BGA packages are low thermal dissipation, electrical performance limited by the number of conductor layers, and associated costs of substrates with multiple metal and dielectric layers, and package reliability and susceptibility to moisture.

The electrical performance and thermal dissipation of a BGA package can be significantly enhanced by a "cavity down" BGA package. A "cavity down" BGA package typically has a die cavity in a multilayer printed circuit board (PCB) substrate. The multilayer substrate allows lower parasitic impedance, and inclusion of a metal slug at the bottom of the cavity increases thermal dissipation of the package. A chip cavity or recess in the package is required to allow sufficient clearance for the chip and its interconnecting wire bonds when the package has been assembled onto a printed wiring board.

A "cavity down" BGA package can also be fabricated using a substrate with multilayer PCB technology. Both "cavity up" and "cavity down" BGA packages using such substrates suffer from high cost, and as the pin count increases, the limitations of PCB printing technology force larger package sizes with increased inductance resulting from the longer conductor length.

In an attempt to provide a substrate with higher circuit density and to allow assembly of high pin count devices, a TGA (TAB Grid Array) package 200 was disclosed and a cross section is shown in FIG. 2. The TGA uses a TAB (Tape automated bond) flexible tape 202 with fine line interconnections for inner lead bonding of the tape conductors to bumps on the chip. The flexible tape 202 has a dielectric layer 209 and 210 on either side of the metal 203a layer with traces which provide interconnection between the chip contacts and solder balls 211 on the package. The tape is attached by an adhesive 208 to a stiffener 206 with a cavity for housing the semiconductor chip 201. The chip is protected by an encapsulating material 204. Solder balls 211 for external connection are attached to the interconnection traces, and in selected locations 213 to the stiffener which acts like a ground plane. While this approach has merits, it is based on TAB or wire bonding of the die, both of which are limited to perimeter bonded integrated circuit chips, and may not be acceptable for very high pin count devices. In addition, TAB bonding has not proved to be an industry accepted, production worthy process, largely because of high costs. Wire bonding adds inductance to the circuit and becomes a limiting feature for very high performance and high pin count devices.

More advanced integrated circuits are being designed with flip chip interconnections. These circuits often require reliable, high performance BGA packages to support the emerging trends of flip chip interconnection and of chips having multiple operating voltages.

SUMMARY OF THE INVENTION

In accordance with the preferred embodiment of the present invention, a cavity down BGA package is provided comprising a flip chip interconnected integrated circuit, a stiffener or package base, an interposer circuit having two conductive metal layers separated by a dielectric layer, and a frame which serves the dual purposes of providing electrical interconnection between the interposer circuit and the external solder ball terminals, and a cavity for housing the integrated circuit chip.

Routing for signal, power and ground contacts, including one or more power and ground planes are provided on the interposer circuit. Metallization on the first surface of the interposer circuit provides routing from the flip chip terminals of the integrated circuit to power planes and /or bus structures, to external bump contacts, and through vias to the ground plane on the second metal layer. Through the use of specific boundaries multiple power buses and planes on the same metal layer are achieved, thus supporting a need for packaging an integrated circuit with multiple operating voltages.

Contact pads with solder bumps on the first surface of the interposer circuit correspond to metallized vias in the frame. The solder bumps provide both mechanical and electrical contact between the interposer circuitry and the external solder ball contacts. The second surface of interposer circuit is adhered to the stiffener. Integrity of the small bumps which provide contact between the interposer and stiffener base and the frame, as well as the flip chip bumps on the integrated circuit is enhanced by underfill materials designed to absorb thermal and mechanical stresses between dissimilar materials of the package. External solder ball terminals are connected to the frame and contact the flex circuit through vias in the frame. The cavity of the package is filled with a polymeric compound for environmental and mechanical protection.

In an alternate embodiment, an interposer circuit having electrical routing for signal, power and ground contacts accomplished on two conductor layers through selective planes and buses with specific boundaries is assembled in a cavity up BGA configuration.

DETAILED DESCRIPTION OF THE PREFERRED EMBODIMENT

Figure 1:
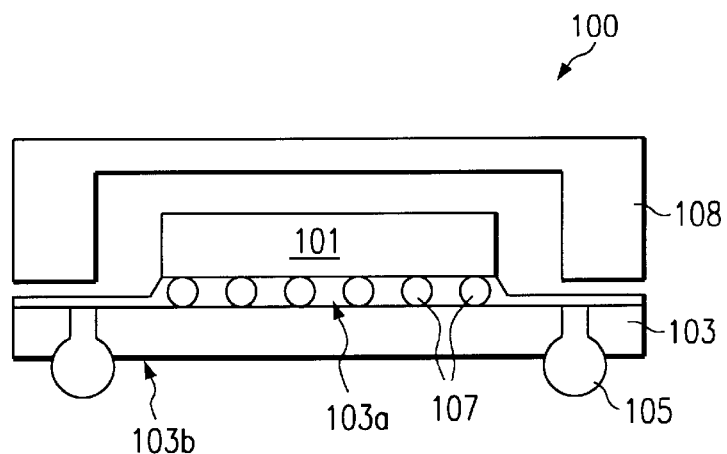
FIG. 1 is a cross sectional view of a cavity up BGA (ball grid array) package. Prior Art
Figure 2:
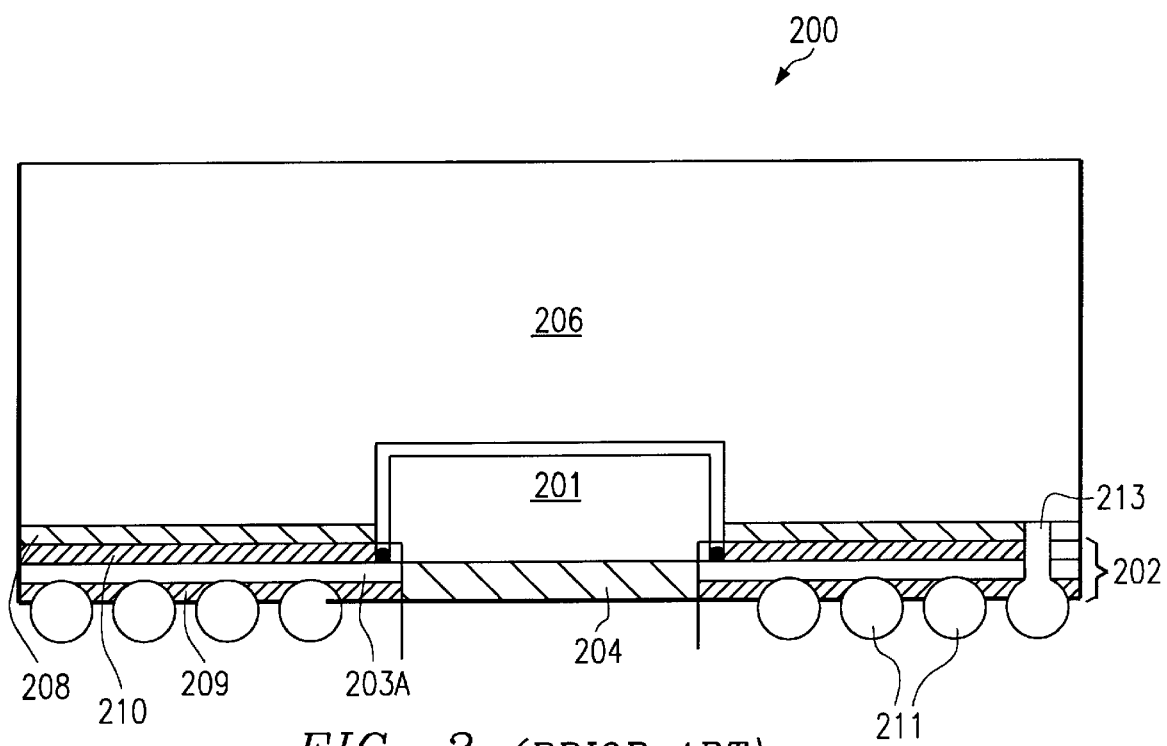
FIG. 2 is a cross-sectional view of a TAB Grid Array package (TGA). Prior Art
Figure 3A:
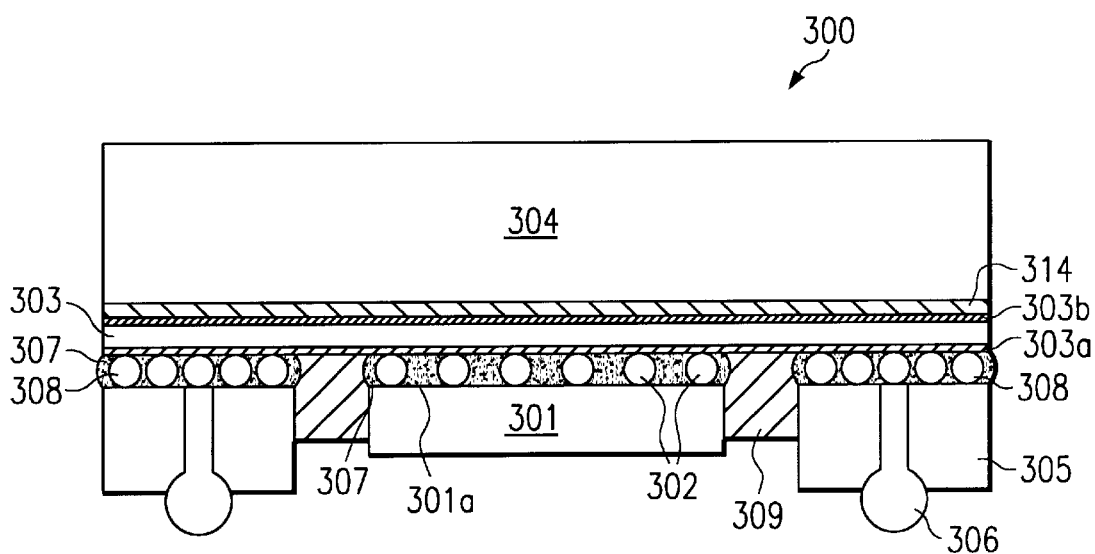
FIG. 3a is a cross-sectional view of a flip chip Cavity down BGA of the present invention.

A preferred embodiment of the present invention, a cavity down BGA package 300, is shown in a cross-sectional view in FIG. 3a. An integrated circuit chip 301 with flip chip contacts 302, such as solder bumps arrayed on the active surface of the chip 301a, is electrically connected to metallized contact pads on the first surface 303a of an interposer circuit 303. The second surface 303b of the interposer circuit 303 is adhered by an insulating adhesive 314 to a planar stiffener 304 which is the base of the package. An interposer circuit includes a core dielectric material which may be a supported BT or FR-4 resin type polymer, an unsupported polyimide or alternate high temperature polymer, or a ceramic. Electrical conductors are disposed on both major surfaces of the dielectric core, and conductive vias provides interconnection between the surfaces.

The package outline is defined by the stiffener which provides both mechanical support to the device, and a large thermal dissipation path to the ambient, or to an attached heat sink. A frame 305, attached by solder bumps 308 to the interposer circuit 303 on the stiffener, forms the package cavity, and provides support for external BGA solder ball 306 contacts. An "underfill" material 307, typically a polymer loaded with electrically insulating particles provides mechanical support to the small solder bumps 302 of the flip chip connections, and to the solder bump connections 308 between the interposer circuit and the frame. The term solder bump is intended to refer to a connector of any shape, such as a sphere, column, or hour glass shaped connector, attached by a solder connection, but neither the connection nor bump are limited to a specific solder composition. The package cavity is filled with a polymeric potting compound 309 to protect the chip and interconnections against contaminants, and to add mechanical support to the package.

Figure 3B:
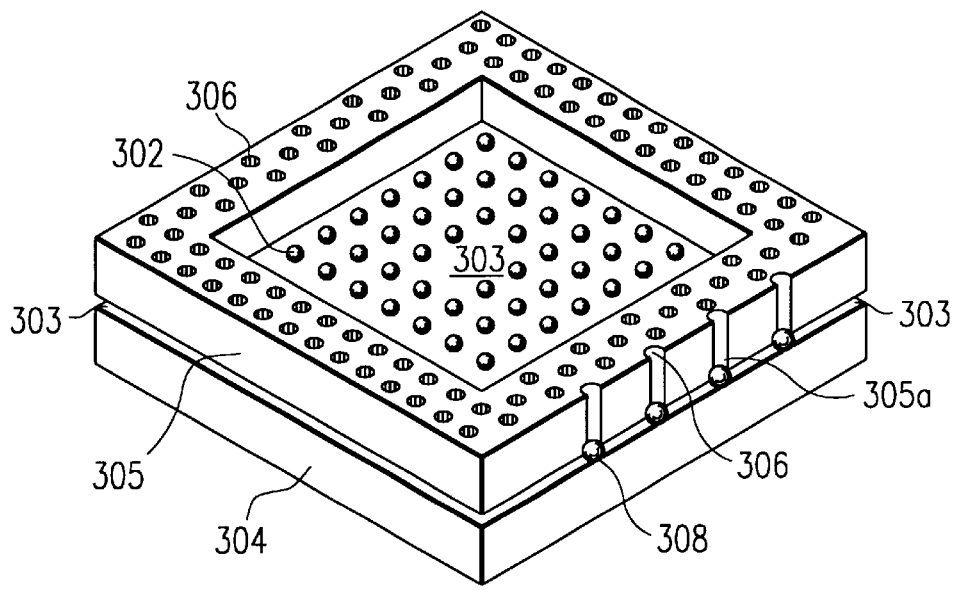
FIG. 3b is cut away bottom view of the flip chip Cavity Down BGA of the present invention.

FIG. 3b provides a cut away view of the bottom surface or the package, i.e., the surface which will face and connect to a printed wiring board. FIG. 3b includes a partial representation of the connectors between the package components in the cavity down BGA of the present invention. A unique feature of the preferred embodiment of the present invention provides that solder bumps 302 mechanically and electrically connect the flip chip integrated circuit (not shown) to the interposer circuit 303, and further that a second set of solder bumps 308, both electrically and mechanically connect the interposer circuit 303 to metallized conductive vias 305a in the frame 305. The solder bumps 308 and connective vias 305a are shown on one side of the frame in a cut away view. The conductive vias 305a, in turn, provide electrical contact between the interposer circuit and sites for external solder balls 306. Solder bumps 308 between the frame and interposer circuit are in the same size range as the flip chip bumps 302, whereas the external solder balls of a BGA are larger, and are typical of industry standards. Solder bumps for flip chip and interposer to frame are typically in the range of 0.04 to 0.20 millimeters in diameter, whereas external solder ball contacts on BGA packages are in the range of 0.5 to 1.25 millimeters.

The frame 305 attached to the stiffener and interposer, creates a cavity for the integrated circuit chip. The frame is thicker than the chip, thereby providing a clearance space atop the chip when the package is attached to a printed wiring board. Integrated circuit chips are typically in the range of 0.25 to 0.50 millimeters and the frame thickness is in the range of 0.3 to 0.60 millimeters.

Core materials for the frame are consistent with those typically used in the industry for integrated circuit packaging. Those with acceptable dielectric properties and with known technology for conductive vias include, but are not limited to FR-4, FR-5 and BT resins. Preferred materials for the stiffener are compatible with the frame in coefficient of thermal expansion, and have high thermal conductivity, or have thermally conductive vias. Such materials include, but are not limited to copper based alloys with protective coatings, or FR-4, FR-5 or BT resin with thermal vias.

Figure 4A:
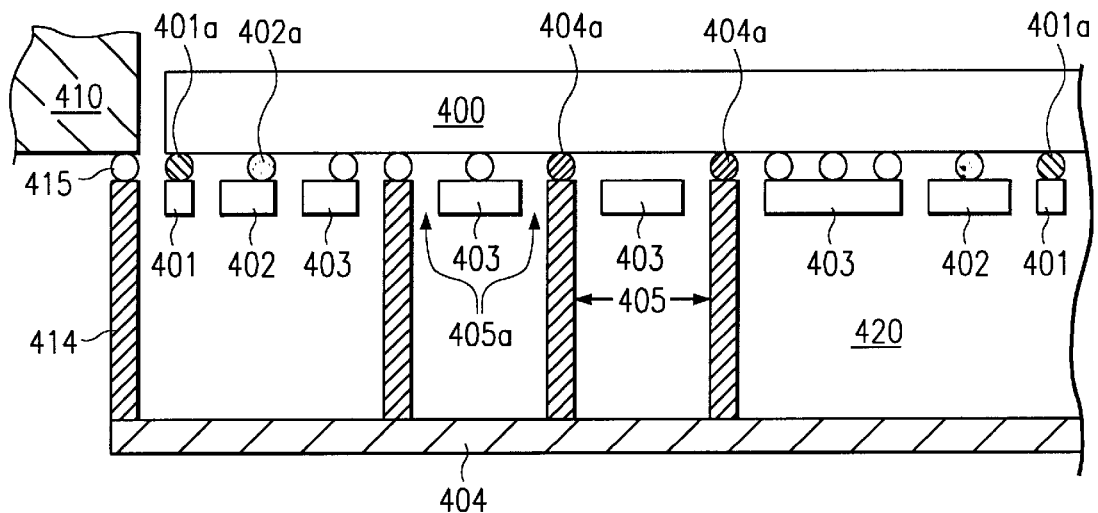
FIG. 4a is a detailed cross-sectional view of an interposer circuit.
Figure 4B:
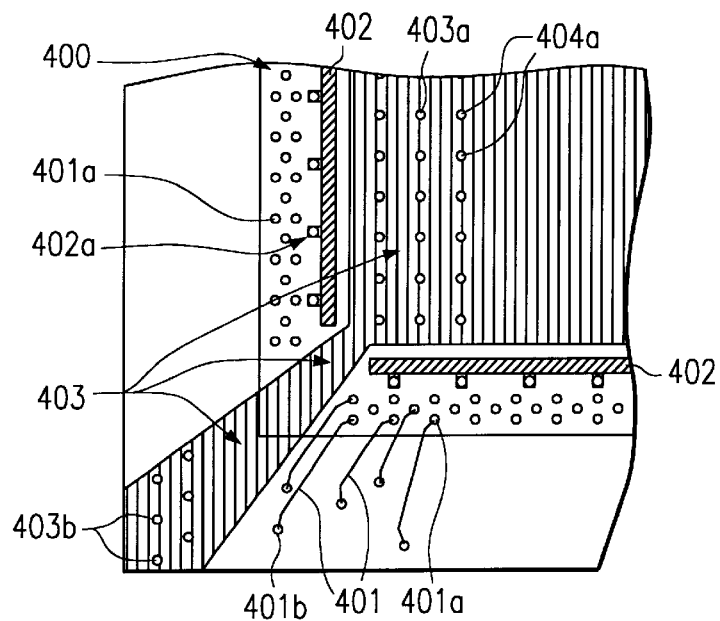
FIG. 4b shows signal, power, and ground contacts and routing, and one power plane on the one surface of the interposer.

FIGS. 4a and 4b explain further the significant electrical routing of the cavity down BGA of this invention. The interposer circuit facilitates routing of signal, power and ground through the use of selective planes and buses with specific boundaries on only two conductor layers, as opposed to four or more layers required with multilayer substrates. The unique routing of conductors supports the need for a simpler and less costly package for an integrated circuit which requires multiple power and ground planes.

Figure 5:
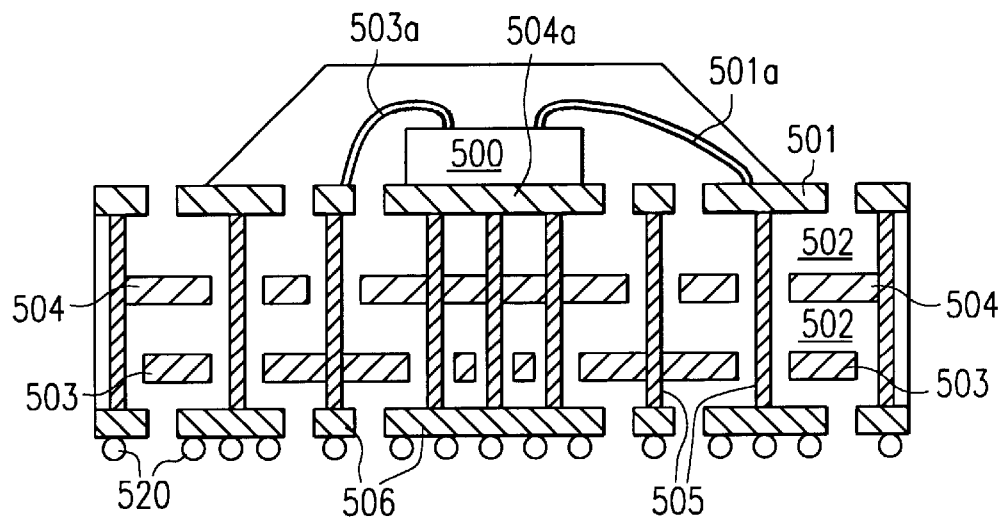
FIG. 5 is a cross-sectional view of a multilayer BGA package. (Prior art)

A cross-sectional view of one embodiment of the interposer circuitry of the current invention is the shown in FIG. 4a, and for comparison, a cross section of circuitry in a multilayer package of existing technology is shown in FIG. 5. In FIG. 5, it can be seen that contacts to the integrated circuit 500 are made on the first metal level 501 and that a ground plane 504 is disposed between dielectric layers of the BGA core 502, and that a power plane 503 is disposed on a different level. Contacts to the signal 501a, power 503a and ground 504a are made through a plurality of vias 505 to external solder balls 520. The external solder balls are on yet another metal layer 506. It should be noted that the levels must be carefully aligned and that sufficiently large openings in the planes be defined to avoid contact with the incorrect plane. For example, the via from a ground contact 504a comes into contact with the ground plane 504, but cannot touch not the power plane 503.

By contrast, the device of the current invention, as shown in FIG. 4a, has only two conductive layers. A plurality of power and ground contacts on the integrated circuit 400, located in the center of the flip chip are connected to corresponding contact pads on the first conductive surface of the interposer. Ground contacts 404a made to conductive vias 405 are surrounded by apertures 405a in the otherwise continuous conductive metal power plane 403. The vias 405 provide contact to the ground plane 404 on the second conductor surface. The broad area of metal corresponding to the center of the chip is one power plane 403.

Nearer to the chip perimeter a second set of bump contacts 402a for a different operating voltage on the chip, are interconnected by a power bus structures 402 on the interposer. Signal contacts 401a located near the chip perimeter are interconnected by signal traces 401 on the interposer to respective external signal contacts 401b, as shown in FIG. 4b. Returning to FIG. 4a, contact from the ground plane to external ground solder ball contacts on the frame is made through vias 414 to small solder balls 415 on the frame 410. From the cross-sectional view in FIG. 4a, it can be seen that multiple power planes, chip contacts to signal, power and ground and contact pads to the external connectors are made on a single selectively patterned level of metal, and that the second level of metal is a ground plane 404. The two levels of metal are separated and electrically isolated by a core dielectric layer 420.

In FIG. 4b, a partially populated quarter section of a first metal level of the interposer circuit is shown. In the central area of the interposer are flip chip bump contacts 404a to vias (not shown) interconnecting to the ground plane 404 in FIG. 4a on the second level, and flip chip contacts 403a for a large power plane 403 on the first metal level. The large power plane 403 is selectively routed to each of the package corners where the external contact pads 403b are located.

Near the location corresponding to the chip 400 perimeter, signal contacts 401a are made to the respective traces 401 interconnecting to the respective external contact pads 401b.

Figure 4C:
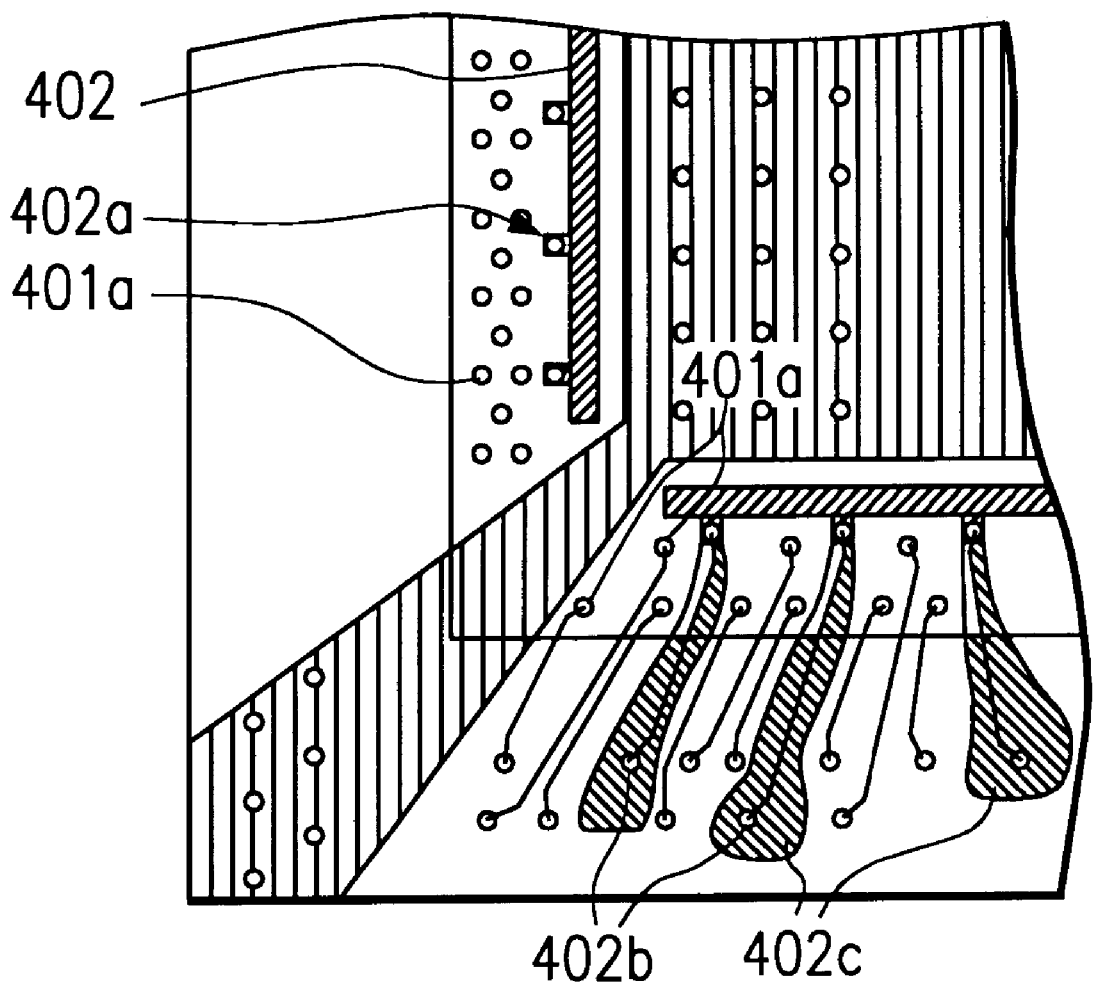
FIG. 4c shows signal, power, and ground contacts and routing and a second power plane on one surface of the interposer.

Power buses 402 with contacts 402a to a different on-chip power supply are also located near the chip perimeter. In FIG. 4c, it can be seen in greater detail that staggered among the signal contacts 401a are power contacts 402a for the second operating power level on-chip. A plurality of power contacts 402a are routed to a bus structure 402 which in turn is routed between the signal traces 401 to provide one or more second power planes 402c and to the external contacts 402b for planes 402c. Openings in the metallized power plane isolate the signal interconnection traces. Each power plane 402c is connected to a bus structure 402, and each bus structure may have a plurality of contacts from the chip for a given operating voltage. Multiple power buses and power planes are possible on a single metal level. In order to provide lower inductance these power planes are preferably designed to occupy the maximum available area between signal routes, and within the routing constraints of the interposer circuit.

External contact from signal, power and ground is made through vias in the frame 410 to external solder balls.

By the use of selective areas for power planes and by busing a plurality of power contacts, it is possible to provide multiple power planes on the same metal level, and thereby support the need of an integrated circuit with different operating voltages for separate power planes. A unique contact system of solder bumps to the frame, and subsequently to external contacts is also provided on the first conductor layer. A need for vias in the interposer circuit is eliminated, except those to the ground plane. A large ground plane in close proximity to the power and signal circuitry is provided on the second metal layer of the interposer circuit. Further, it is possible to eliminate the second level of metal and make use of a conductive stiffener or layer on the stiffener for a broad ground plane.

A specific embodiment of the cavity down BGA of the current invention is a high pin count device, about 352 pins, having a flip chip bonded integrated circuit wherein the signal and a first set of power contacts from a 3.3 volt power supply are located near the chip perimeter. The contacts arrayed near the chip center are to ground and to a second set of power contacts from a 1.8 volt power supply. A plurality of flip chip solder bumps comprising lead and tin provide electrical and mechanical contact between the chip contact pads and corresponding metallized contact pads on the first surface of a interposer circuit.

The interposer circuit of the preferred embodiment is a flexible circuit comprising a polyimide based film in the range of 0.005 to 0.015 inches thickness with a thin film of copper interconnection circuitry disposed on both surfaces. The metal is photopatterned to provide the circuit design, and the metal traces are plated with the appropriate metals to meet the resistivity requirements of the circuit, and for environmental stability. Vias are punched, etched, or laser drilled, and are filled with a conductive material. Flex circuits include some of the same technology as TAB tape technology, but the thicker flex films are sufficiently rigid and dimensionally stable to allow metallization on both sides without distortion. A high density of interconnection is achieved on both sides of film with flex circuit technology, whereas film with TAB interconnect circuitry is typically metallized on a single side.

Circuitry, in the preferred embodiment, on the first surface of the interposer includes signal routing, a plurality of contacts to power buses and two broad power planes, generically as described in the combination of FIGS. 4b and 4c. A solder mask covers the interconnect circuitry and surrounds the contact pads.

The second surface of the interposer circuitry includes a large ground plane of copper metallization which is electrically connected to the first surface ground contacts by conductive vias. The second surface of the flexible interposer is attached to a stiffener by an insulating adhesive layer. The stiffener provides the package base and is comprised of a clad copper alloy in the range of 0.015 to 0.05 inches thickness.

A generic representation of package components for the preferred embodiment is given in FIGS. 3a and 3b.

A frame with conductive vias arrayed to correspond to the BGA package terminals, and to the input/output contacts of the device is attached to the first surface of the flexible circuit by a plurality of solder bumps. The solder bump connectors are of similar size and composition to those of the flip chip solder bumps. The frame is located within the perimeter of the stiffener, and serves as a cavity for the chip, as well as a support for interconnections between the solder bumps of the interposer circuit and the external solder balls of the BGA package. The frame is in the range of 0.020 to 0.030 inches thick and is comprised of FR-4 material.

An underfill material of a thixotropic thermosetting polymer surrounds the small solder bumps which connect the flip chip and the frame to the flexible circuit. The material absorbs thermally induced stresses on the solder joints, and seals the package edge from ingress of external contamination between the frame and interposer circuit.

The package cavity is filled with a potting compound, such as a thermosetting epoxy filled with a silica to control the expansion coefficient to about 20 PPM.

Figure 6:
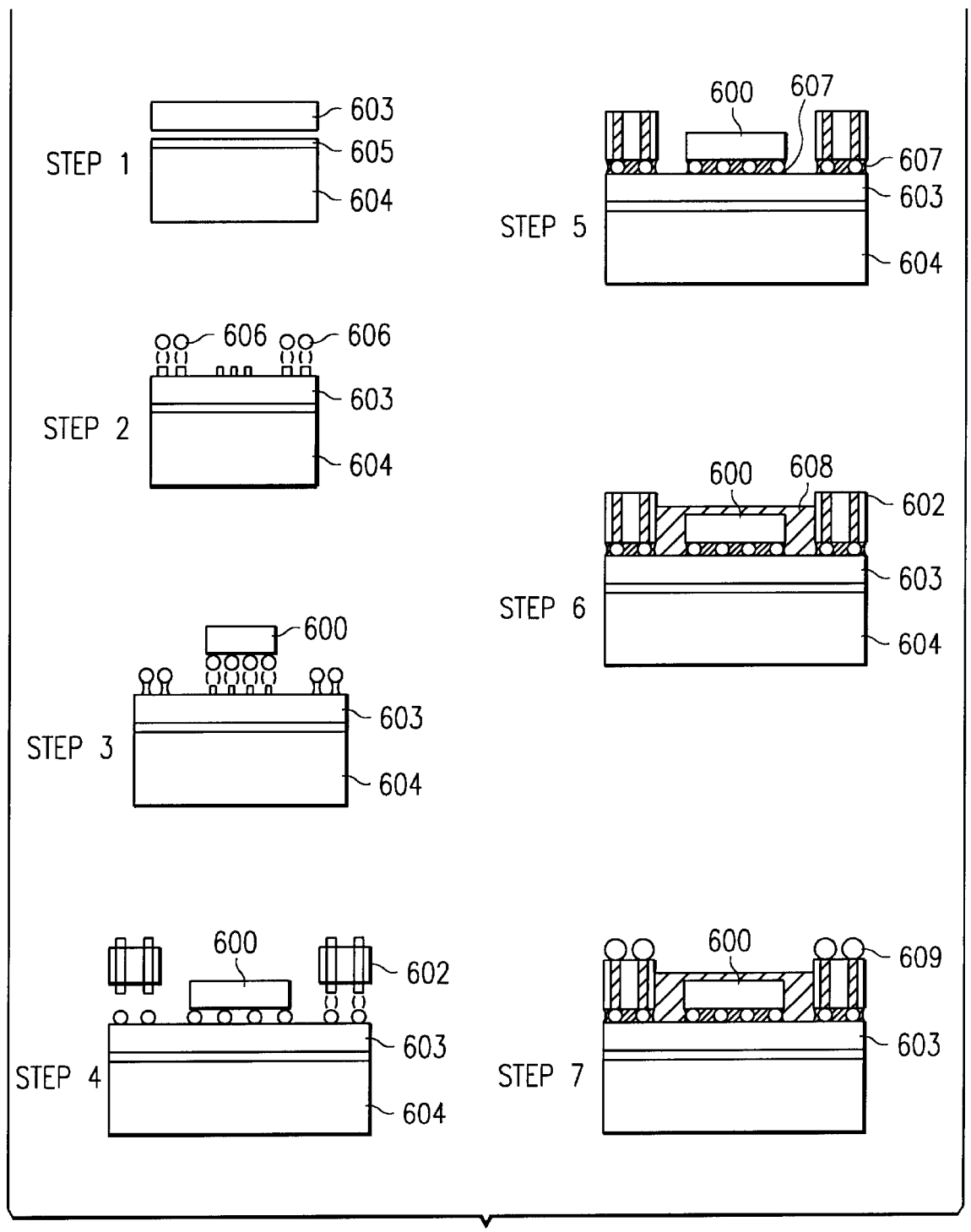
FIG. 6 outlines the process flow for assembly of a cavity down flip chip BGA package.

Assembly of the specific package of the preferred embodiment as described above includes the following series of steps, most of which are known in the industry. FIG. 6 provides a simple process flow diagram for assembly of a flip chip integrated circuit in a cavity down package of the current invention.

In step 1, the second surface of a flexible interposer 603 having two patterned conductive layers with protective solder masks is aligned to one surface of a stiffener 604 or package base, and is adhered by a thin film of thermosetting insulating adhesive 605. The adhesive is cured by heat treatment to form a stable, single component.

In step 2, an array of preformed solder balls 606 is aligned to the perimeter contact pads on the interposer circuit. Heat is applied to the interposer and the temperature is raised sufficiently to initiate reflow of solder balls and hold the solder firmly in place, about 190 degrees centigrade for a few seconds. The heat may be applied by an optical source or by a convection method.

An integrated circuit 600 with attached solder bump contacts is aligned to and brought into contact with contact pads in the central portion of the interposer in step 3. Heat is supplied by either an optical system, or a convection system to reflow the solder bumps of both the chip and the perimeter bumps.

At step 4, a frame 602 is positioned with the outer edge vertically aligned to the stiffener and fine alignment made to bring the solder bumps into contact with vias in the frame. Heat is applied to reflow the solder bumps a second time and secure the frame to the interposer and stiffener assembly.

An underfill polymeric compound 607 is applied at the chip perimeter and the frame perimeter at the fifth process step. The compound is allowed to flow into the spaces between all bumps and provide a seal between the frame and stiffener. The compound is thermally cured at about 125 degrees centigrade for 5 to 15 minutes to form a mechanically and chemically stable polymer.

A thermosetting potting compound 608 is applied to fill the package cavity and the polymer is fully cured during the same thermal cycle, which also serves as the final cure of the underfill compound. Convection curing at 150 degrees centigrade for 30 minutes completes the curing process.

External solder balls 609 are aligned to the exposed contacts on the frame, heat is applied to reflow the balls and complete assembly of the integrated circuit package.

Figure 7:
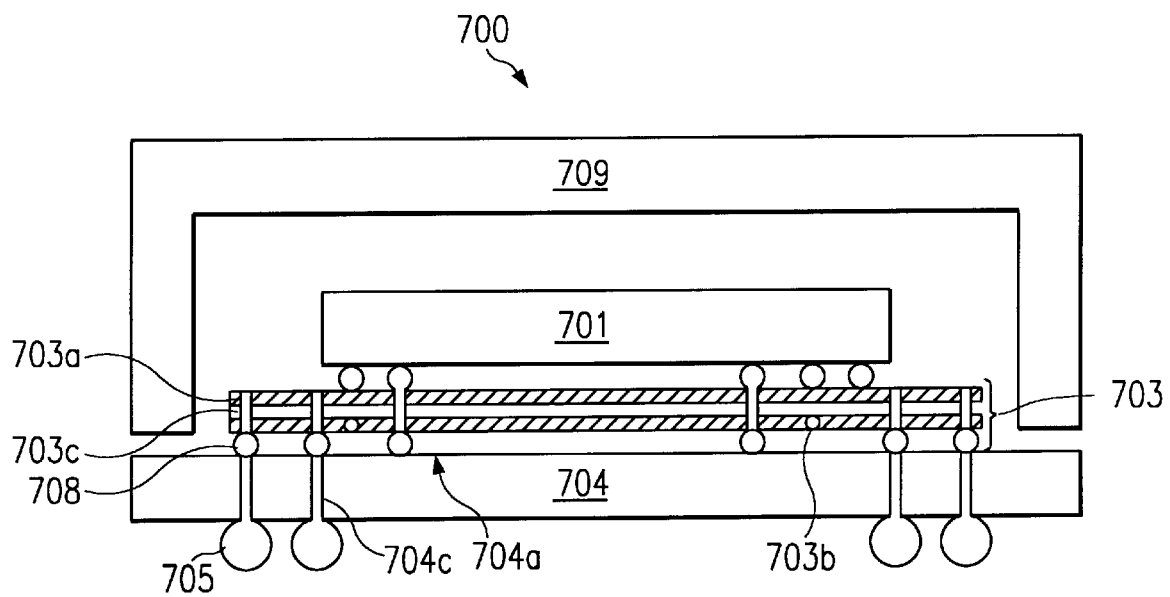
FIG. 7 is a cross sectional view of a cavity up BGA with an interposer circuit having two conductor surfaces.

In FIG. 7, a second embodiment of the current invention is demonstrated. A flip chip integrated circuit 701 on an interposer circuit 703 having electrical routing for signal, power, and ground contacts, and multiple power planes, is accomplished on two conductor layers through selective planes and buses with specific boundaries, and is packaged in a cavity up BGA 700 configuration.

In FIG. 7 it can be seen that an interposer circuit 703 having routing generally as shown in FIGS. 4b and 4c with multiple power planes on the first metal layer 703a and a ground plane on the second metal layer 703b is inserted into a cavity up BGA package 700. The BGA package 700 includes a stiffener or base 704 with conductive vias 704c between the external BGA solder ball terminals 705 and contact pads on the upward facing surface 704a. Connection between the base vias 704c and the interposer vias 703c is provided by a plurality of solder bumps 708 on the second surface of the interposer circuit 703b. The ground plane covers the center portion of the second surface of the interposer circuit, and apertures are provided for vias for signal and power contacts near the perimeter. Housing for the package is completed by encapsulation in a polymer or by a protective cap 709 attached to the base.

Routing of complex circuitry on an interposer having only two conductive surfaces allows multiple packaging options. A low cost, standardized package base and cap is adaptable to specific circuits customized on the interposer.

The detailed descriptions above are provided to illustrate specific embodiments of the present invention, and are not intended to be limiting of the present invention. Numerous modifications and variations within the scope of the present invention are possible. The present invention is defined by the following claims.

What is claimed is:

1. A cavity down ball grid array (BGA) package for a flip chip interconnected integrated circuit including;

a) a planar stiffener or package base which dissipates heat from the circuit to the atmosphere, or to a secondary heat spreader, b) an interposer circuit comprising two patterned conductor layers separated by a dielectric layer, wherein electrical routing for signal, power and ground contacts is patterned on the two conductor layers, including selective planes and buses with specific boundaries to form at least one power plane within the chip mount perimeter on the first conductor layer, said first conductor layer also including a plurality of contact pads in the central area, aligned to the flip chip connectors, and electrically interconnecting to an array of input/output contact pads near the interposer perimeter, a ground plane included in the second conductor layer, wherein conductive vias provide interconnection between specific contacts on the first and second conductor layers, wherein the second surface is adhered to said stiffener by an insulating adhesive, c) an array of solder bumps of similar size and composition to the flip chip connectors, disposed on each of the input/output contact pads near the interposer perimeter, d) a frame of greater thickness than said integrated circuit chip, positioned with the outer edge vertically aligned to the outer edge of the stiffener, having a first surface aligned to and connecting the solder bumps of on the interposer perimeter to conductive vias through the frame core to external BGA solder ball contacts on the second surface of the frame, e) an underfill material surrounding the flip chip bumps, and the frame solder bump connectors, and f) an encapsulating compound which fills cavity formed by the frame and stiffener.

2. A cavity down BGA as in claim 1 wherein a first power plane is disposed in the center of the first patterned conductor layer and is bused to each corner of the interposer circuit, and a second power plane is also disposed in the first patterned conductor layer of the interposer circuit, located near the interposer perimeter, between signal routing interconnections to external contacts.

* * * * *